(12) United States Patent
Miyazawa (10) Patent No.: US 6,949,811 B2
(45) Date of Patent: Sep. 27, 2005

(54) DEVICE HAVING INTERDIGITAL CAPACITOR

(75) Inventor: Naoyuki Miyazawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/396,461

(22) Filed: Mar. 26, 2003

(65) Prior Publication Data

US 2003/0183864 A1 Oct. 2, 2003

(30) Foreign Application Priority Data

Mar. 28, 2002 (JP) ........................................ 2002-093378

(51) Int. Cl.[7] .............................................. H01L 29/00
(52) U.S. Cl. ........................ 257/532; 257/534; 257/535; 331/99
(58) Field of Search ................................ 257/532, 534, 257/535; 331/99

(56) References Cited

U.S. PATENT DOCUMENTS 5,821,827 A * 10/1998 Mohwinkel et al. .......... 331/99

* cited by examiner

*Primary Examiner*—Edward Wojciechowicz
(74) *Attorney, Agent, or Firm*—Westerman, Hattori, Daniels & Adrian, LLP (57) ABSTRACT

A device includes a transistor, and two interdigital capacitors. The transistor is located on an imaginary extension line aligned with a common electrode of the two interdigital capacitors.

37 Claims, 7 Drawing Sheets

DEVICE HAVING INTERDIGITAL CAPACITOR

BACKGROUND OF THE INVENTION

1. Field of the Invention

The present invention generally relates to a device having a capacitor, such as an oscillator, and more particularly, to an interdigital capacitor used in a high-frequency circuit.

2. Description of the Related Art

An MIM (Metal Insulator Metal) capacitor and an interdigital capacitor are known as capacitors used in high-frequency circuits that handle a frequency as high as 1 GHz or over. Usually, these capacitors are incorporated in an MMIC (Monolithic Microwave Integrated Circuit). For example, the MIM is made up of a pair of electrodes formed on a semi-insulating GaAs substrate, and a dielectric member interposed between the pair of electrodes. The interdigital capacitor has an interdigital electrode pattern formed on a semi-insulating GaAs substrate.

Generally, the capacitor is required to have a smaller capacitance, as the frequency is higher. For example, the capacitance required in the 40 GHz band is as small as 30 fF. The capacitor having such a small capacitance should be compact. For instance, a capacitance of 30 fF by an MIM capacitor having a per-unit-area capacitance of 0.4 fF/$\mu m^2$ needs an extremely small squire electrode having a side of 8.7 $\mu m$. The capacitance will deviate from the capacitance of 30 fF unless the above dimensions are accurately realized. Such a deviation of the capacitance will affect the circuit operation. For example, the oscillator employing the MIM capacitor will have a frequency error that depends on a capacitance deviation. It is to be noted that current technology has a difficulty in accurate production of an electrode pattern of MIM capacitor having a side equal to or smaller than 10 $\mu m$. In other words, the MIM capacitors currently available have a large variation in capacitance.

Figure 1:
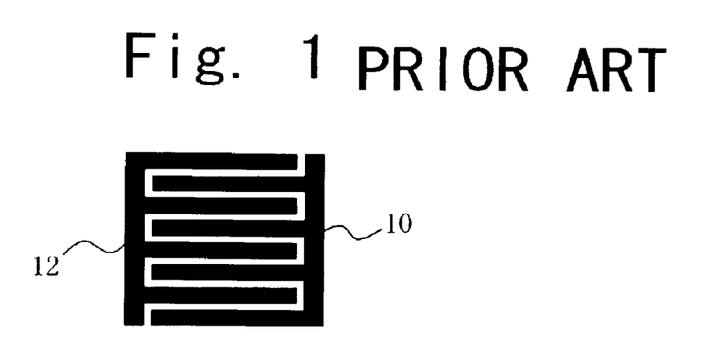
FIG. 1 is a plan view of a conventional interdigital capacitor.

In contrast, the interdigital capacitor is suitable for use in a millimeter wave band higher than 30 GHz, and is capable of accurately realizing a capacitance as small as tens of fF. FIG. 1 illustrates an interdigital capacitor, which is made up of a semiconductor substrate of, for example, silicon or a semi-insulating GaAs, and an interdigital electrode pattern formed on the substrate. The electrode pattern is composed of two comb-like electrodes 10 and 12. Electrode fingers of the comb-like electrodes 10 and 12 are alternately arranged. In order to realize a capacitance of about 30 fF by the interdigital capacitor, it should have an electrode finger width of 5 $\mu m$, an finger-to-finger gap of about 2 $\mu m$, and dimensions of 50 $\mu m \times 50 \mu m$ as a whole.

Figure 2:
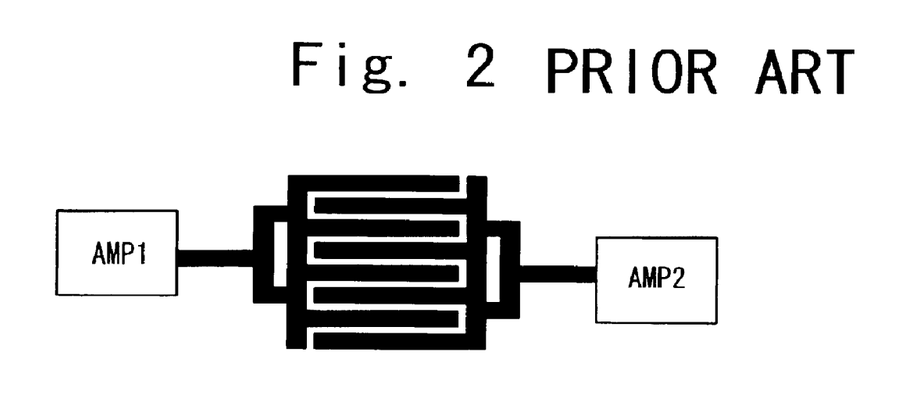
FIG. 2 is a plan view of an application of the interdigital capacitor.

As shown in FIG. 2, the interdigital capacitor may be used as a decoupling capacitor that is provided between high-frequency amplifiers AMP1 and AMP2. The amplifiers AMP1 and AMP2 and the interdigital capacitor are approximately aligned. This arrangement is little affected by parasitic inductance coupled to interconnection or wiring lines. In contrast, a problem may occur for a circuit made up of a transistor and some interdigital capacitors connected thereto. An example of such a circuit is an oscillator. In many cases, it is difficult to connect the interdigital capacitors and the transistors in a short distance. As the interconnection length increases, the parasitic inductance increases. An increased parasitic inductance may affect the circuit operation. High-frequency circuits are required to have symmetry of circuit pattern. For instance, in case where a differential circuit fails to have a symmetrical circuit pattern, a phase difference between differential signals may arise therefrom. The phase difference serves as a noise source. It is to be noted that there is difficulty in designing a symmetrical circuit pattern on the substrate in which some transistors and the interdigital capacitor shown in FIG. 1 are connected with short interconnection lines. Problems that arise from parasitic inductance and asymmetry of circuit pattern greatly affect circuit operations and characteristics, particularly, in a millimeter wave range over 30 GHz.

SUMMARY OF THE INVENTION

It is a general object of the present invention to provide a device having an interdigital capacitor in which the above problems are eliminated.

A more specific object of the present invention is to provide a device having an interdigital capacitor that induces only small parasitic inductance and easily realizes symmetry of pattern layout.

According to an aspect of the present invention, there is provided a device comprising: a transistor; and two interdigital capacitors, the transistor being located on an imaginary extension line aligned with a common electrode of the two interdigital capacitors.

According to another aspect of the invention, there is provided a device comprising: first and second transistors; first and second interdigital capacitors connected to the first transistor; and third and fourth interdigital capacitors connected to the second transistor, wherein: the first transistor being located on an imaginary extension line continuing to a first common electrode of the first and second interdigital capacitors; the second transistor being located on an imaginary extension line continuing to a second common electrode of the third and fourth interdigital capacitors; and the second and third interdigital capacitors are formed by a third common.

According to yet another aspect of the invention, there is provided a device comprising: first and second transistors; first and second interdigital capacitors connected to the first transistor; and third and fourth interdigital capacitors connected to the second transistor, wherein: the second and third interdigital capacitors have a first common electrode including a straight bus line; and the first transistor and the first and second interdigital capacitors, and the second transistor and the third and fourth interdigital capacitors have symmetry about the first common electrode.

According to a further aspect of the present invention, there is provided a device comprising: first and second transistors; first and second interdigital capacitors connected to the first transistor; and third and fourth interdigital capacitors connected to the second transistor, wherein: the first and second interdigital capacitors have a first common electrode including a first straight bus line; the third and fourth interdigital capacitors have a second common electrode including a second straight bus line; and the first and second bus lines are arranged in a line.

According to another aspect of the present invention, there is provided a device comprising: first and second transistors; first and second interdigital capacitors connected to the first transistor; and third and fourth interdigital capacitors connected to the second transistor, wherein: the first and second interdigital capacitors have a first common electrode including a first straight bus line; the third and fourth interdigital capacitors have a second common electrode including a second straight bus line; and a first circuit pattern including the first transistor and the first and second interdigital capacitors and a second circuit pattern including the second transistor and the third and fourth interdigital capacitors have axial symmetry.

According to another aspect of the present invention, there is provided a communication device comprising: a circuit that processes a transmit or receive signal in synchronism with an oscillation signal; and a device supplying the circuit with the oscillation signal, the device being configured as mentioned above.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description is given of embodiments of the present invention with reference to the accompanying drawings.
(First Embodiment)

Figure 3A:
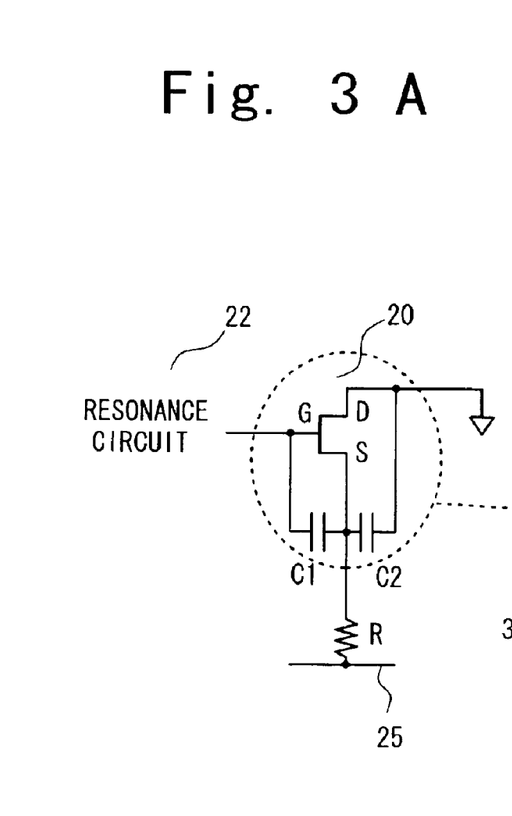
FIG. 3A is a circuit diagram of a device according to a first embodiment of the present invention.
Figure 3B:
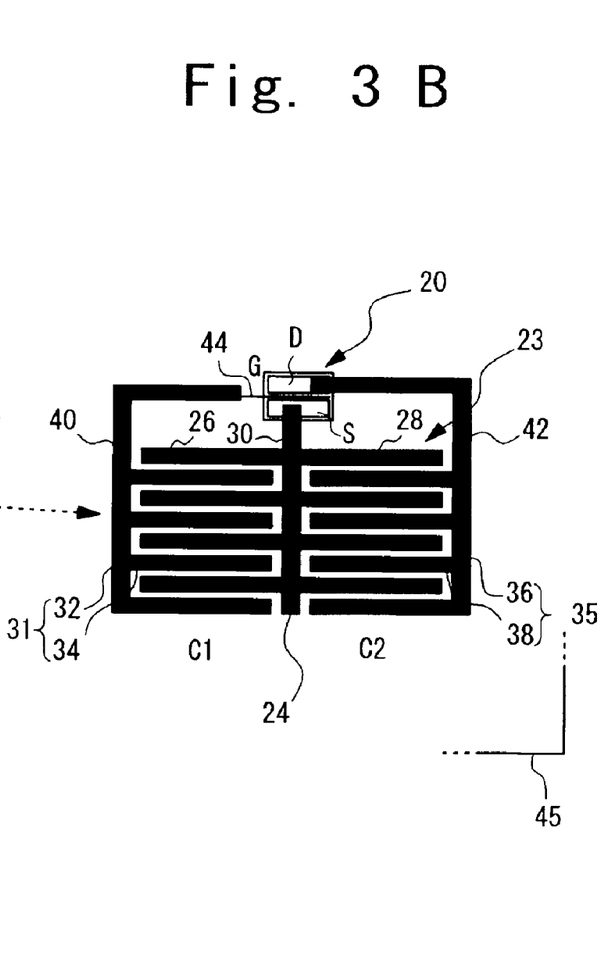
FIG. 3B is a plan view of a layout of the device according to the first embodiment of the present invention.

FIGS. 3A and 3B show a device according to a first embodiment of the present invention. More particularly, FIG. 3A is a circuit diagram of the device, and FIG. 3B is a plan view of a circuit pattern or layout of the device.

The device is an oscillator having a circuit configuration of FIG. 3A. The oscillator includes a field effect transistor 20, two capacitors C1 and C2, a bias resistor R and a resonance circuit 22. The capacitor C1 is connected between the gate G and source S of the transistor 20. The capacitor C2 is connected to the drain D and source S of the transistor 20. The drain D of the transistor 20 is held at a given potential (for example, the ground potential). The source S of the transistor 20 is connected to a power supply line 25 (via which a negative power supply voltage is available) via the bias resistor R. The resonance circuit 22 is connected to the gate G of the transistor 20. The capacitors C1 and C2 makes a capacitance division, and collaborate with the transistor 20 so as to exhibit a negative resistance value at desired frequencies. The resonance circuit 22 may be implemented by, for example, a spiral inductor.

A part surrounded by the broken line shown in FIG. 3A has a circuit pattern illustrated in FIG. 3B. The capacitors C1 and C2 have an identical capacitance, and are interdigital capacitors. The interdigital capacitors C1 and C2 have a common electrode 23. The common electrode 23 has a bus line (may be called bus bar) 24 and multiple electrode fingers 26 and 28. The electrode fingers 26 and 28 run from the bus line 24 in the opposite directions. It is now assumed that the direction from the bus line 24 to the left is defined as a first direction, and the direction from the bus line 24 to the right is defined as a second direction. The first and second directions have a difference of 180°. The electrode fingers 26 and 28 of the common electrode 23 are adjacent to the source S of the transistor 20. The electrode fingers 26 and 28 are aligned across the bus line 24. The common electrode 23 is a kind of comb-like electrode. In the arrangement shown in FIG. 3A, the electrode fingers 26 and 28 have an identical length, and the number of electrode fingers 26 is equal to that of electrode fingers 28. The bus line 24 is linear, and the transistor 20 is located on an imaginary line running from the bus line 24 straightforward. The transistor 20 is located on an imaginary extension line aligned with the common electrode 24 of the two interdigital capacitors C1 and C2.

A source electrode region S and a drain electrode region D of the transistor 20 in FIG. 3B are close to the bus line 24. The source electrode region S and the drain electrode region D of the transistor 20 are arranged side by side in the direction in which the bus line 24 runs. It is to be noted that the symbol S is used to indicate the source or the source electrode region and the symbol D is used to indicate the drain or the drain electrode region. The bus line 24 is connected to the source electrode region S via a straight interconnection line 30. The interconnection line 30 shown in FIG. 3B has a width that is the same as that of the bus line 24, but may have a different width. For example, the interconnection line 30 is narrower than the bus line 24. It is also possible to handle the interconnection line 30 as part of the bus line 24. The relationship between the width of the bus line 24 and the interconnection line 30 holds true for other bus lines and interconnection lines.

The common electrode 23 and a comb-like electrode 31 make the interdigital capacitor C1. Similarly, the common electrode 23 and a comb-like electrode 35 make the interdigital capacitor C2. The comb-like electrode 31 has a bus line 32 and multiple electrode fingers 34, which run in the second direction. The electrode fingers 26 of the common electrode 23 and the electrode fingers 34 of the comb-like electrode 31 are alternately arranged. The bus line 32 is connected to a gate G of the transistor 20 serving as a control terminal via an approximately L-shaped interconnection line 40. The comb-like electrode 35 has a bus line 36 and multiple electrode fingers 38, which run from the bus line 36 in the first direction. The electrode fingers 28 of the common electrode 23 and the electrode fingers 38 of the comb-like electrode 35 are alternately arranged. The bus line 36 is connected to the drain electrode region D of the transistor 20 via an approximately L-shaped interconnection line 42. In FIG. 3B, the interconnection lines 40 and 42 have the same widths as the bus lines 32 and 36, but may have different widths. For example, the interconnection lines 40 and 42 may be narrower than the bus lines 32 and 36.

The patterns of electrodes and interconnection lines are formed on a semiconductor substrate 45. In FIG. 3B, only one corner of the semiconductor substrate 45 is illustrated for the sake of simplicity. The patterns of electrodes and interconnection lines may be made of, for example, aluminum, gold or cooper. An insulating film made of, for example, polyimide or silicon oxide may be deposited on the surface of the substrate 45 including the patterns of electrodes and interconnection lines.

The following effects can be brought about by the first embodiment of the present invention.

First, the common electrode 23 having the structure shown in FIG. 3B does not need any interconnection lines for making a connection between two interdigital capacitors separately arranged. Therefore, only a little parasitic inductance may exist. As a result of this improvement, stable oscillation can be achieved at desired frequencies. In contrast, the conventional device has a large parasitic inductance coupled to a comparatively long interconnection line that connects the two interdigital capacitors. Second, the common electrode 23 shown in FIG. 3B enables two interdigital capacitors to be implemented in an area narrower (smaller) than the conventional area for two interdigital capacitors. It is therefore possible to reduce the area on the semiconductor substrate 45 occupied by the interdigital capacitors and to miniaturize the substrate 45 or chip. The miniaturization of the chip may realize shorter interconnection lines for making connections with the transistor. Thus, only a small parasitic inductance is coupled to the shorter interconnection lines, and stable oscillation is available at desired frequencies. Third, the electrode pattern that makes the interdigital capacitors C1 and C2 has axial symmetry about the bus line 24 of the common electrode 23. The electrode pattern shown in FIG. 3B has symmetry of layout required in the high-frequency circuit. Fourth, the electrode fingers 26 and 28 that have the same potential as the source electrode region S are those close to (more strictly, closest to) the source electrode region S. It is thus possible to reduce fringing capacitances between the source S and gate G of the transistor 20 and between the source S and drain D. If the interdigital capacitor shown in FIG. 3B has a size that does not care fringing capacitance very much, the arrangement of FIG. 3B may be varied so that the electrode fingers 34 and 38 are closest to the source electrode region S. Fifth, the symmetry of the approximately L-shaped interconnection lines 40 and 42 easily realizes symmetry of circuit pattern including the lines connected to the transistor 20. Therefore, the device shown in FIG. 3B can be suitably applied to the high-frequency circuit.

The arrangement of FIG. 3B may be varied so that the electrode fingers 26 and 28 are positioned closer to portions of the approximately L-shaped interconnection lines 40 and 42, these portions being parallel to the electrode fingers 26 and 28 and being connected to the gate G and drain D, respectively. In this case, the connecting portions of the lines 40 and 42 may serve as part of the interdigital capacitor. In this case, it is to be noted that the space between the electrode finger 26 and the connecting portion of the interconnection line 40 connected to the gate electrode G is different from the space between the electrode finger 28 and the connecting portion of the interconnection line 42 connected to the drain electrode region D. The above difference corresponds to the difference in position between the gate electrode G and the drain electrode region D. If the capacitors C1 and C2 are strictly required to have an identical capacitance, at least one of the interconnection lines 40 and 42 will be changed so as to have a crank portion that is located close to the transistor 20 so that the interconnection lines 40 and 42 substantially have symmetry about the transistor 20. In other words, the crank portion enables the first and second interconnection lines 40 and 42 to be spaced apart from the electrode fingers 26 and 28 by an identical distance. In this manner, the layout may be optimized by only minor change.

The narrowed spaces between the interconnection lines 40 and 42 and the electrode fingers 26 and 28 effectively serve as part of the interdigital capacitor and reduce the parasitic inductance.

(Variation of the First Embodiment)

Figure 4:
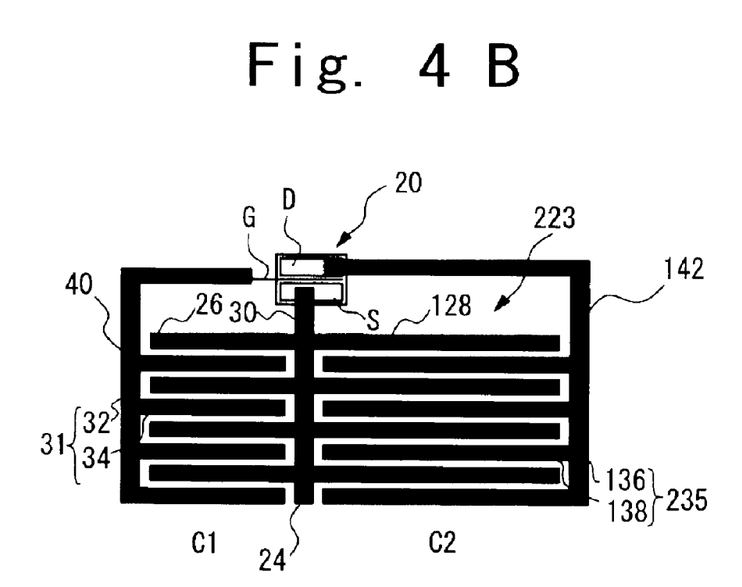
FIG. 4A is a plan view of a first variation of the device according to the first embodiment of the present invention.
FIG. 4B is a plan view of a second variation of the device according to the first embodiment of the present invention.

FIG. 4A shows a first variation of the first embodiment of the present invention, and FIG. 4B shows a second variation thereof. In FIGS. 4A and 4B, parts that are the same as those shown in FIGS. 3A and 3B are given the same reference numerals. In each of the first and second variations, the interdigital capacitors C1 and C2 have different capacitance values. In FIGS. 4A and 4B, the capacitance of the capacitor C2 is larger than that of the capacitor C1 (C2>C1).

The structure shown in FIG. 4A is intended to realize the different capacitances of the capacitors C1 and C2 by using different numbers of electrode fingers. A common electrode 123 is a comb-like electrode that is composed of a bus line 124, m electrode fingers 26 and n electrode fingers 28 where m and n are different natural numbers. The bus line 124 and the electrode fingers 26 and 28 are formed on a semiconductor substrate of, for example, semi-insulating GaAs. The m electrode fingers 26 run from the bus line 124 in the first direction, and the n electrode fingers 28 run in the second direction therefrom. In FIG. 4A, m=4 and n=6. The (n−m) electrode fingers 28 that do not have the counterpart electrode fingers 26 are located in a longer distance from the transistor 20. The comb-like electrode 135 that makes the interdigital capacitor C2 includes the bus line 36 and n electrode fingers 38. The n electrode fingers 38 of the comb-like electrode 135 and the electrode fingers 28 of the common electrode 123 are alternately arranged. Since n>m as described above, the interdigital capacitor C2 has a capacitance larger than that of the interdigital capacitor C1.

The structure shown in FIG. 4B is intended to realize the different capacitances of the capacitors C1 and C2 by using different lengths of electrode fingers. A common electrode 223 formed on a substrate made of, for example, a semi-insulating GaAs, is composed of the bus line 24, the electrode fingers 26 running from the bus line 24 in the first direction, and electrode fingers 128 running therefrom in the second direction. The number of electrode fingers 26 is equal to that of electrode fingers 128. As is clearly shown in FIG. 4B, the electrode fingers 128 have an identical length but are longer than the electrode fingers 26. A comb-like electrode 235 that makes the interdigital capacitor C2 has a bus line 136 and electrode fingers 138. The length of the electrode fingers 138 corresponds to that of the electrode fingers 128. For example, the electrode fingers 138 have the same length as that of the electrode fingers 128. The bus line 136 is connected to the drain electrode region D via an approximately L-shaped interconnection line 142.

The structures of FIGS. 4A and 4B bring about the same effects as those of the first embodiment of the present invention.

Figure 5:
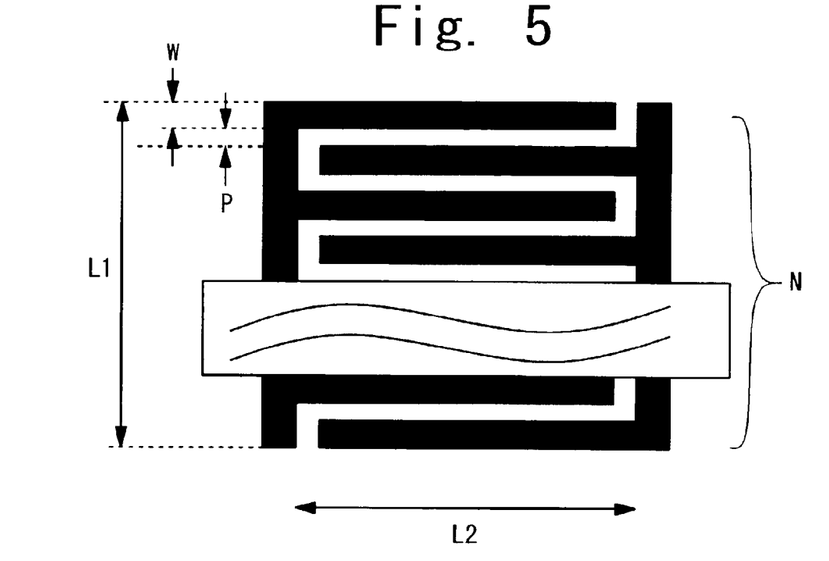
FIG. 5 is a diagram for explaining the capacitance of the interdigital capacitor.

A description will now be given, with reference to FIG. 5, of the capacitance of the interdigital capacitor. FIG. 5 shows an interdigital capacitor composed of a pair of comb-like electrodes. The electrode pattern is formed on a semiconductor substrate made of, for example, semi-insulating GaAs. The following symbols denote parameters of the interdigital capacitor. A symbol L1 denotes the length of the interdigital capacitor, and L2 denotes the length of the electrode fingers. N denotes the total number of electrode fingers, and W denotes the width thereof. P denotes the space (pitch) between the adjacent electrode fingers. A capacitance of about 0.05 pF can be provided as follows: L1 is approximately equal to 60 μm, L2=50 μm, W=2 μm, P=2 μm, and N=16. The interdigital capacitors C1 and C2 shown in FIG. 4A have different lengths L1, and the interdigital capacitors C1 and C2 shown in FIG. 4B have different lengths L2 of electrode fingers.

(Second Embodiment)

Figures 6A, 6B:
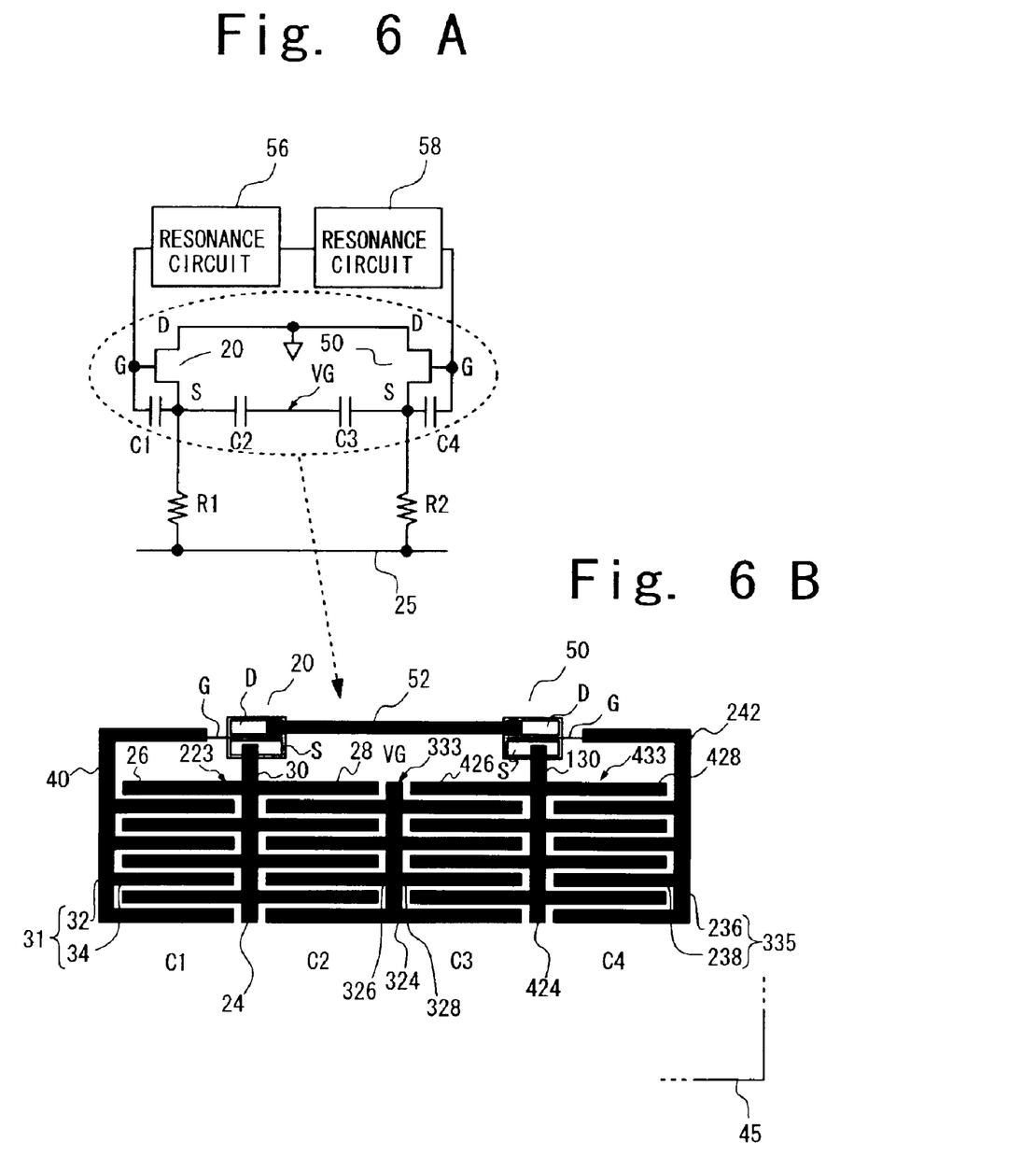
FIG. 6A is a circuit diagram of a device according to a second embodiment of the present invention.
FIG. 6B is a plan view of a layout of the device according to the second embodiment of the present invention.

FIGS. 6A and 6B illustrate a device according to a second embodiment of the present invention. This device is a differential oscillator. FIG. 6A is a circuit diagram of the differential oscillator, and FIG. 6B shows a layout of a part surrounded by the broken line shown in FIG. 6A. In FIGS. 6A and 6B, parts that are the same as those shown in the previously described figures are given the same reference numerals.

Referring to FIG. 6A, the differential oscillator is composed of a first circuit part and a second circuit part. The first circuit part includes the transistor 20, the interdigital capacitors C1 and C2, a resonance circuit 56 and a bias resistor R1. The second circuit part includes a transistor 50, interdigital capacitors C3 and C4, a resonance circuit 58 and a bias resistor R2. Drains D of the transistors 20 and 50 are connected and set at a reference potential (for example, ground potential). The capacitors C2 and C3 are connected to a virtual ground point VG for preventing in-phase oscillation. The resonators 56 and 58 are connected and include respective inductors. The bias resistors R1 and R2 are connected to a power supply line 25.

Referring to FIG. 6B, the interdigital capacitors C1 through C4 include three common electrodes 223, 333 and 433. For the conveniences' sake, the common electrodes 223, 333 and 433 may be referred to as first, third and second common electrodes, respectively. The common electrode 223 relates to the interdigital capacitors C1 and C2, and the common electrode 333 relates to the interdigital capacitors C2 and C3, the common electrode 433 relating to the interdigital capacitors C3 and C4. The common electrode 223 has the bus line 24 and the first and second electrode fingers 26 and 28 respectively running from the bus line 24 in the first and second directions. The bus line 24 is connected to the source electrode region S of the transistor 20 via the straight interconnection line 30. The common electrode 333 includes a bus line 324 and electrode fingers 326 and 328 that run from the bus line 324 in the first and second directions, respectively. The electrode fingers 28 and 326 are alternately arranged and make the interdigital capacitor C2. The common electrode 433 has a bus line 424 and electrode fingers 426 and 428 that run from the bus line 424 in the first and second directions. The electrode fingers 328 and 426 are alternately arranged and make the interdigital capacitor C3. The bus line 424 is connected to the source electrode region S of the transistor 50 via a straight interconnection line 130. A comb-like electrode 335 has a bus line 236 and electrode fingers 238 that run therefrom in the first direction. The electrode fingers 428 and 238 are alternately arranged and make the interdigital capacitor C4. The bus line 236 is connected to the gate of the transistor 50 via an approximately L-shaped interconnection line 242. The drain electrode regions D of the transistors 20 and 50 are connected via a straight interconnection line 52.

The circuit pattern shown in FIG. 6B has axial symmetry about the third common electrode 333. The interdigital capacitors C1–C4 have symmetry electrode pattern, and further circuit parts including the transistors 20 and 50 have symmetry pattern. Thus, the signal of the first circuit part including the transistor 20 and that of the second circuit part including the transistor 50 are 180 degrees out of phase, and have no phase difference due to asymmetry. The transistor 20 and the common electrode 223 are connected by the straight interconnection line 30 that is very short. Similarly, the transistor 50 and the common electrode 433 are connected by the straight interconnection line 130 that is very short. Further, the L-shaped interconnection lines 40 and 242 are very short. Only the short interconnection lines are used, so that very small parasitic inductances may be coupled thereto and designed capacitance values can be provided by the capacitors C1 through C4. Thus, the accurate oscillation frequency is available.

The interdigital capacitors C1 through C4 are not required to have the same capacitance value but may have different capacitance values. Different capacitance values may be obtained by applying the electrode patterns shown in FIGS. 4A and/or 4B to the pattern of FIG. 6B.

(Third Embodiment)

Figure 7:
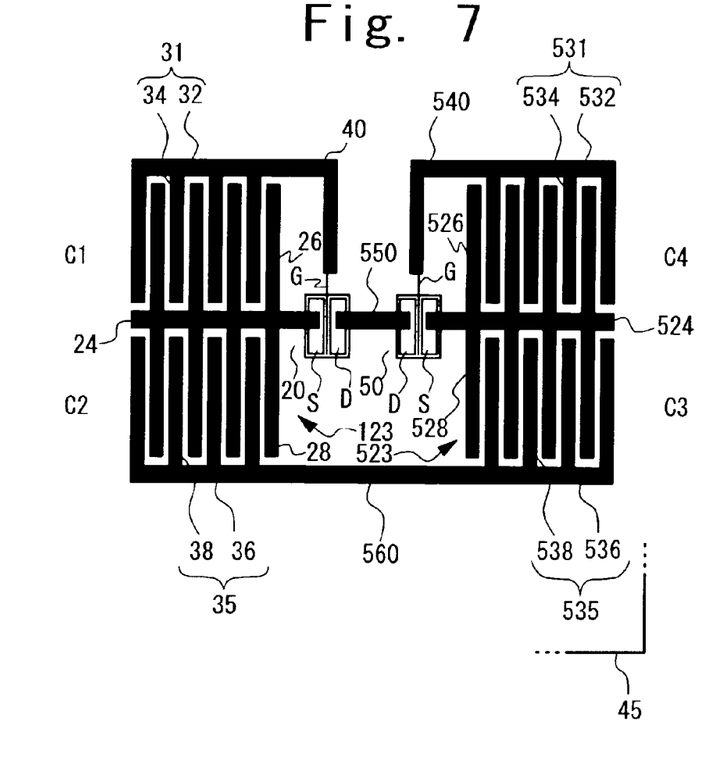
FIG. 7 is a plan view of a layout of a device according to a third embodiment of the present invention.

FIG. 7 is a plan view of a device according to a third embodiment of the present invention. This device has a circuit pattern that realizes the circuit part surrounded by the broken line in FIG. 6A and differs from the circuit pattern shown in FIG. 6B. In FIG. 7, parts that are the same as those shown in the previously described figures are given the same reference numerals.

The device of FIG. 7 includes the transistors 20 and 50, the first and second interdigital capacitors C1 and C2 connected to the transistor 20, and the third and fourth interdigital capacitors C3 and C4 connected to the second transistor 50. The first and second interdigital capacitors C1 and C2 have the first common electrode 123 including the straight bus line 24. The third and fourth interdigital capacitors C3 and C4 have a second common electrode 523, which includes a straight bus line 524. The bus line 24 of the first common electrode 123 is aligned with the bus line 524 of the second common electrode 524. The transistors 20 and 50 are closely juxtaposed between the first common electrode 123 and the second common electrode 523. The electrode regions S and D of the transistor 20 and the electrode regions S and D of the transistor 50 are located on an imaginary straight line that connects the first common electrode 123 and the second common electrode 523.

The first common electrode 123 has multiple electrode fingers 26 and 28 that run from both the sides of the bus line 24. The electrode fingers 26 are alternately arranged with the electrode fingers 34 that run from the bus line 32 of the comb-like electrode 31. Similarly, the electrode fingers 28 are alternately arranged with the electrode fingers 38 that run from the bus line 36 of the comb-like electrode 35. Electrode fingers 526 of the common electrode 523 are alternately arranged with electrode fingers 534 that run from a bus line 532 of a comb-like electrode 531, so that the interdigital capacitor C4 is made. Similarly, electrode fingers 528 of the common electrode 523 are alternately arranged with electrode fingers 538 that run from a bus line 536 of a comb-like electrode 535, so that the interdigital capacitor C3 is made. The bus line 532 is connected to the gate G of the transistor 50 via an approximately L-shaped interconnection line 540. The bus lines 36 and 536 are connected via a straight interconnection line 560. The drain electrode regions D of the transistors 20 and 50 are connected via a straight interconnection line 550.

The circuit pattern shown in FIG. 7 has perfect symmetry, and therefore meets the requirements in the high-frequency circuit. The transistors 20 and 50 are very close to each other and are connected via the very short straight interconnection line 550. Thus, only a little parasitic inductance may be coupled to the interconnection line 550. The use of the two common electrodes 123 and 523 contributes to reducing the area on the chip occupied by the circuit pattern of FIG. 7. It is also possible to reduce the fringing capacitance related to the transistors 20 and 50 as in the case of the first embodiment of the present invention.

The interdigital capacitors C1 through C4 are not required to have the same capacitance value but may have different capacitance values. Different capacitance values may be obtained by applying the electrode patterns shown in FIGS. 4A and/or 4B to the pattern of FIG. 6B.

(Fourth Embodiment)

Figure 8:
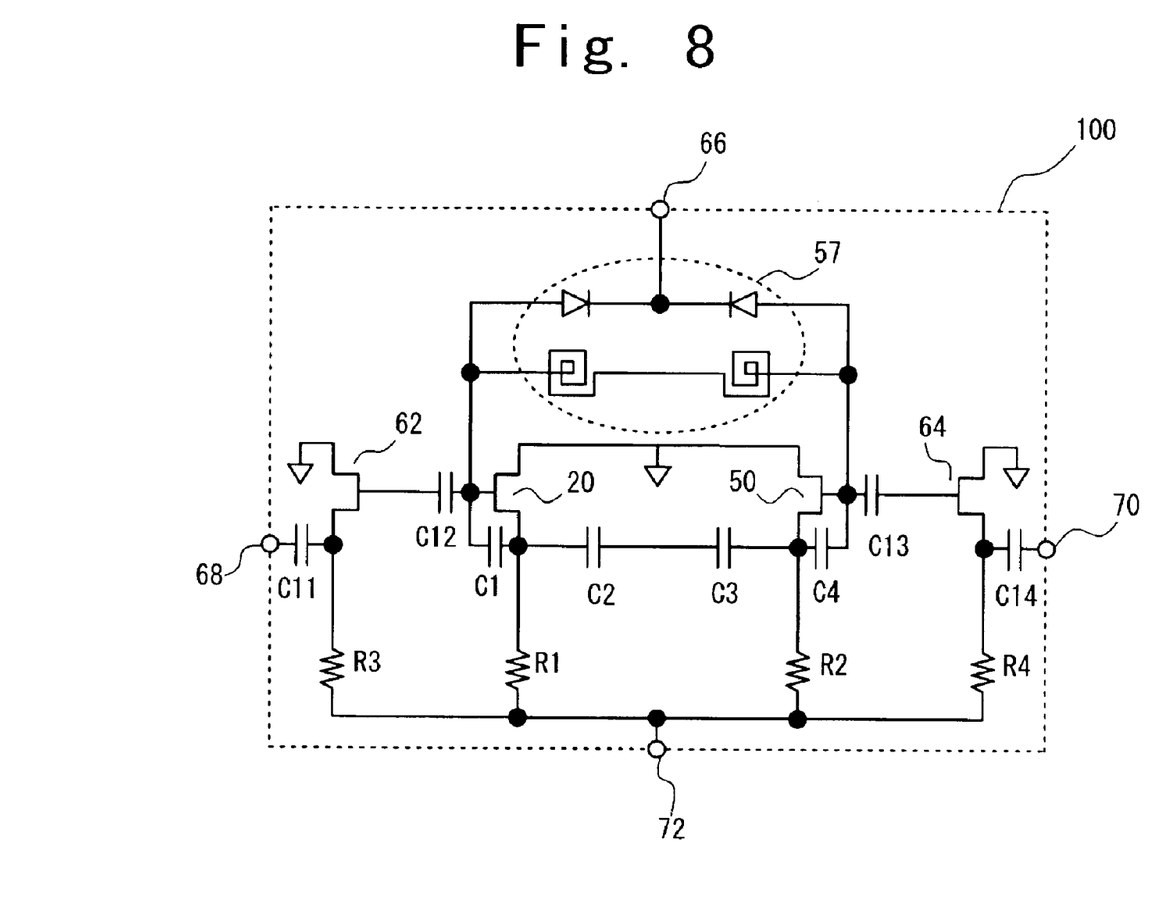
FIG. 8 is a circuit diagram of a device according to a fourth embodiment of the present invention.

FIG. 8 is a circuit diagram of a device according to a fourth embodiment of the present invention. This device is an MMIC device having differential oscillators formed on a chip 100. The reference number 100 also indicates a package of the device. The circuit shown in FIG. 8 is formed on the chip 100 of, for example, semi-insulating GaAs. In FIG. 8, parts that are the same as those shown in the previously described figures are given the same reference numerals.

The differential oscillator has the same circuit configuration as the circuit of FIG. 6A. Two oscillation outputs are available via source-follower field effect transistors 62 and 64. The gate of the transistor 20 is coupled to the gate of the source-follower transistor 62 via an interdigital capacitor C12 for cutting the DC component. The drain of the transistor 62 is grounded, and the source thereof is connected to a power supply terminal 72 via a bias resistor R3 and to an output terminal 68 via a DC-cut interdigital capacitor C11. The gate of the transistor 50 is connected to the gate of the transistor 64 via a DC-cut interdigital capacitor C13. The drain of the transistor 64 is grounded, and the source thereof is connected to the power supply terminal 72 via a bias resistor R4 and to an inverted output terminal 70 via a DC-cut interdigital capacitor C14.

A circuit part surrounded by a broken line 57 is a resonance circuit that corresponds to the resonance circuits 56 and 58 shown in FIG. 6A. The resonance circuit 57 is composed of two spiral inductors and two diodes. The cathodes of the diodes are connected to a terminal 66 for making an external connection. This terminal 66 is a frequency control terminal. The oscillation frequency depends on the voltage applied to the terminal 66.

The circuit of FIG. 8 may be realized by using the circuit patterns shown in FIGS. 6B and 7. Thus, the present voltage-controlled oscillator device is capable of accurately generating desired oscillation frequencies in the millimeter wave band.

(Fifth Embodiment)

Figure 9A:
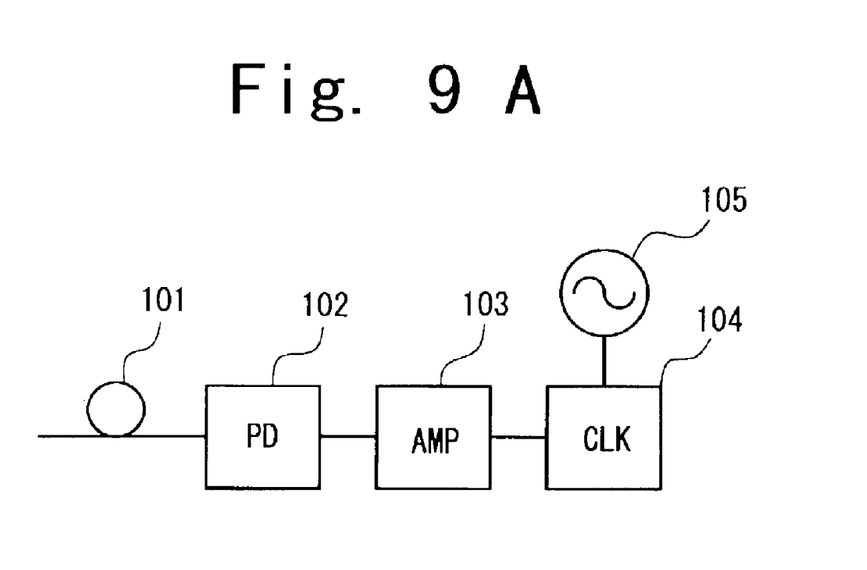
FIGS. 9A and 9B are respectively block diagrams of communication devices according to a fifth embodiment of the present invention.
Figure 9B:
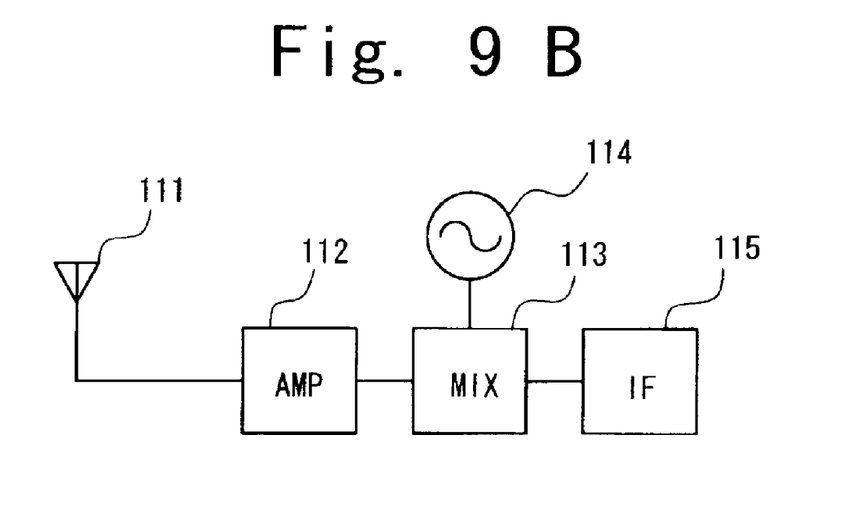

FIGS. 9A and 9B are diagrams of communication devices according to a fifth embodiment of the present invention. More particularly, FIG. 9A shows an optical communication device having a transmission bit rate of 10 Gbps or more, and FIG. 9B shows a millimeter wave radio transmitter.

The optical communication device shown in FIG. 9A includes a photodiode (PD) 102 connected to an optical fiber 101, a preamplifier (AMP) 103, a clock extraction IC (CLK) 104, and an oscillator 105. This oscillator 105 employs some interdigital capacitors of the present invention. An optical signal received from the optical fiber 101 is converted into an electric signal by the photodiode 102. The electric signal is amplified by the preamplifier 103. The clock extraction IC 104 is synchronized with an oscillation frequency of the oscillator 105, and extracts a clock from the output of the preamplifier 103 in synchronism with the oscillation frequency.

Referring to FIG. 9B, an intermediate frequency signal supplied from an internal circuit not shown is processed by an IF signal processing circuit (IF) 115. The output signal of the circuit 115 is sent to an up-convert mixer (MIX) 113, which mixes the IF signal with an oscillation signal output by an oscillator 114 of the present invention and employs the interdigital capacitor of the present invention. The up-converted signal is amplified by a transmission amplifier (AMP) 112, and is then transmitted via an antenna 111.

The present invention is not limited to the specifically disclosed embodiments, and other embodiments, variations and modifications may be made without departing from the scope of the present invention.

The present invention is based on Japanese patent application no. 2002-093378 filed on Mar. 28, 2002, the entire disclosure of which is hereby incorporated by reference.

What is claimed is:

1. A device comprising:
    a transistor; and
    two interdigital capacitors,
    the transistor being located on an imaginary extension line aligned with a common electrode of the two interdigital capacitors, the common electrode being connected to one of electrode regions of the transistor.

2. The device according to claim 1, wherein the common electrode has a straight line connected to said one of electrode regions of the transistor.

3. The device according to claim 1, wherein the common electrode is connected to said one of electrode regions of the transistor via a straight interconnection line that continues to the common electrode.

4. The device according to claim 1, wherein the two interdigital capacitors comprise:
    the common electrode having a bus line and electrode fingers running from the bus line in first and second directions;
    a first comb-like electrode having electrode fingers that are alternately arranged with the electrode fingers of the common electrode running in the first direction; and
    a second comb-like electrode having electrode fingers that are alternately arranged with the electrode fingers of the common electrode running in the second direction,
    the electrode regions of the transistor being located on the imaginary extension line aligned with the bus line of the common electrode.

5. The device according to claim 1, wherein the two interdigital capacitors comprise:
    the common electrode having a bus line and electrode fingers running from the bus line in first and second directions;
    a first comb-like electrode having electrode fingers that are alternately arranged with the electrode fingers of the common electrode running in the first direction; and
    a second comb-like electrode having electrode fingers that are alternately arranged with the electrode fingers of the common electrode running in the second direction,
    the bus line of the common electrode being connected to said one of the electrode regions of the transistor via a straight interconnection line that continues to the bus line.

6. The device according to claim 1, wherein the two interdigital capacitors comprise:
    the common electrode having a bus line and electrode fingers running from the bus line in first and second directions;
    a first comb-like electrode having electrode fingers that are alternately arranged with the electrode fingers of the common electrode running in the first direction; and a second comb-like electrode having electrode fingers that are alternately arranged with the electrode fingers of the common electrode running in the second direction, the bus line of the common electrode being connected to a first electrode region of the transistor that corresponds to said one of the electrode regions, the first comb-like electrode being connected to a second electrode region of the transistor, and the second comb-like electrode being connected to a control terminal of the transistor.

7. The device according to claim 1, wherein:

the common electrode has a bus line and electrode fingers that run in two directions; and two electrode regions of the transistor including said one of the electrode regions being located on an imaginary extension line aligned with the bus line.

8. The device according to claim 1, wherein the transistor is close to electrode fingers that run from both sides of a bus line of the common electrode and are arranged in a line.

9. The device according to claim 1, wherein the two interdigital capacitors comprise:

the common electrode having a bus line connected to a first electrode region of the transistor that corresponds to said one of the electrode regions and first and second electrode fingers that run from the bus line in first and second directions;

a first comb-like electrode having electrode fingers that are alternately arranged with the electrode fingers of the common electrode running in the first direction;

a second com-like electrode having electrode fingers that are alternately arranged with the electrode fingers of the common electrode running in the second direction;

a first interconnection line connecting the first comb-like electrode to a second electrode region of the transistor; and a second interconnection line connecting the second comb-like electrode to a control terminal of the transistor.

10. The device according to claims 9, wherein the electrode fingers that run from the bus line include electrode fingers that are close to and in parallel with the first and second interconnection lines so that the first and second interconnection lines can make a capacitance.

11. The device according to claim 10, wherein at least one of the first and second interconnection lines has a crank portion that is located close to the transistor and enables the first and second interconnection lines to be spaced apart from the electrode fingers close to the first and second interconnection lines by an identical distance.

12. The device according to claim 1, wherein the two interdigital capacitors comprise:

the common electrode having a bus line, m (m is a natural number) electrode fingers running from the bus line in a first direction, and n (n is a natural number and is not equal to m) electrode fingers running from the bus line in a second direction;

a first comb-like electrode having electrode fingers alternately arranged with the m electrode fingers; and a second comb-like electrode having electrode fingers alternately arranged with the n electrode fingers, the bus line being connected to said one of the electrode regions of the transistor.

13. The device according to claim 1, wherein the two interdigital capacitors comprise:

the common electrode having a bus line connected to a first electrode region of the transistor that corresponds to said one of the electrode regions, and first and second electrode fingers that run from the bus line in first and second directions;

a first comb-like electrode having electrode fingers alternately arranged with the m electrode fingers; and a second comb-like electrode having electrode fingers alternately arranged with the n electrode fingers, the electrode fingers running in the first direction having a length different from that of the electrode fingers running in the second direction.

14. The device according to claim 1, wherein:

one of the two interdigital capacitors is connected between a gate and source of the transistor, and the other interdigital capacitor is connected between a drain and source of the transistor; and the transistor and the two interdigital capacitors form an oscillator.

15. A device comprising:

first and second transistors;

first and second interdigital capacitors connected to the first transistor; and third and fourth interdigital capacitors connected to the second transistor, wherein:

the first transistor being located on an imaginary extension line continuing to a first common electrode of the first and second interdigital capacitors;

the second transistor being located on an imaginary extension line continuing to a second common electrode of the third and fourth interdigital capacitors; and the second and third interdigital capacitors are formed by a third common electrode.

16. The device according to claim 15, wherein the first and second common electrodes have symmetry about the third common electrode.

17. The device according to claim 15, wherein the first and second common electrodes have symmetry about the third common electrode, and the first and second transistors have symmetry with respect to the third common electrode.

18. The device according to claim 15, wherein the first common electrode has a straight bus line connected to an electrode region of the first transistor; and the second common electrode has another straight bus line connected to an electrode region of the second transistor.

19. The device according to claim 15, wherein:

the first common electrode has a straight bus line connected to one of two electrode regions of the first transistor;

the second common electrode has another straight bus line connected to one to two electrode regions of the second transistor; and the other electrode regions of the first and second transistors are connected via a straight interconnection line.

20. The device according to claim 15, wherein:

the first, second and third common electrodes respectively have bus lines;

electrode fingers run from each of the bus lines in first and second directions;

the electrode fingers that run from the bus line of the first common electrode in the second direction are alternately arranged with the electrode fingers that run from the bus line of the third common electrode in the first direction so that the second interdigital capacitor can be made;

the electrode fingers that run from the bus line of the third common electrode in the second direction are alternately arranged with the electrode fingers that run from the bus line of the second common electrode in the first direction so that the third interdigital capacitor can be made.

21. The device according to claim 15, wherein the first and second transistors and the first through fourth capacitors are elements of an oscillator.

22. The device according to claim 15, wherein the first and second transistors and the first through fourth capacitors are formed on a chip.

23. A device comprising:
first and second transistors;
first and second interdigital capacitors connected to the first transistor; and
third and fourth interdigital capacitors connected to the second transistor,
wherein:
the second and third interdigital capacitors have a first common electrode including a straight bus line; and
the first transistor and the first and second interdigital capacitors, and the second transistor and the third and fourth interdigital capacitors have symmetry about the first common electrode.

24. The device according to claim 23, wherein:
electrode regions of the first transistor are located on an imaginary extension line continuing to a second common electrode of the first and second interdigital capacitors; and
electrode regions of the second transistor are located on another imaginary extension line continuing to a third common electrode of the third and fourth interdigital capacitors.

25. The device according to claim 23, wherein the first and second transistors are connected via a straight interconnection line.

26. The device according to claim 23, wherein the first and second transistors and the first through fourth capacitors are elements of an oscillator.

27. The device according to claim 23, wherein the first and second transistors and the first through fourth capacitors are formed on a chip.

28. A device comprising:
first and second transistors;
first and second interdigital capacitors connected to the first transistor; and
third and fourth interdigital capacitors connected to the second transistor,
wherein:
the first and second interdigital capacitors have a first common electrode including a first straight bus line;
the third and fourth interdigital capacitors have a second common electrode including a second straight bus line; and
the first and second bus lines are arranged in a line.

29. The device according to claim 28, wherein the first and second transistors are close to each other and are located between the first and second common electrodes.

30. The device according to claim 28, wherein electrode regions of the first transistor and those of the second transistor are arranged on an imaginary line that connects the first and second common electrodes.

31. The device according to claim 28, wherein:
the first and second capacitors have electrode fingers that run from both sides of the first common electrode and are close to the first transistor; and
the third and fourth capacitors have electrode fingers that run from both sides of the second common electrode and are close to the second transistor.

32. The device according to claim 28, wherein the first and second transistors and the first through fourth capacitors are elements of an oscillator.

33. The device according to claim 28, wherein the first and second transistors and the first through fourth capacitors are formed on a chip.

34. A device comprising:
first and second transistors;
first and second interdigital capacitors connected to the first transistor; and
third and fourth interdigital capacitors connected to the second transistor,
wherein:
the first and second interdigital capacitors have a first common electrode including a first straight bus line;
the third and fourth interdigital capacitors have a second common electrode including a second straight bus line; and
a first circuit pattern including the first transistor and the first and second interdigital capacitors and a second circuit pattern including the second transistor and the third and fourth interdigital capacitors have axial symmetry.

35. The device according to claim 34, wherein the first and second transistors and the first through fourth capacitors are elements of an oscillator.

36. The device according to claim 34, wherein the first and second transistors and the first through fourth capacitors are formed on a chip.

37. A communication device comprising:
a circuit that processes a transmit or receive signal in synchronism with an oscillation signal; and
a device supplying the circuit with the oscillation signal,
the device comprising:
a transistor; and
two interdigital capacitors,
the transistor being located on an imaginary extension line aligned with a common electrode of the two interdigital capacitors, the common electrode being connected to one of electrode regions of the transistor.

* * * * *